United States Patent [19]
Kim

[11] Patent Number: 5,805,478
[45] Date of Patent: Sep. 8, 1998

[54] DATA DETECTION METHOD AND APPARATUS IN DATA STORAGE DEVICE

[75] Inventor: Yung-soo Kim, Seoul, Rep. of Korea

[73] Assignee: Samsung Electronics Co., Ltd., Kyungki-do, Rep. of Korea

[21] Appl. No.: 663,745

[22] Filed: Jun. 14, 1996

[30] Foreign Application Priority Data

Jun. 17, 1995 [KR] Rep. of Korea ............... 95-16156

[51] Int. Cl.$^6$ .................................................. G06F 17/10
[52] U.S. Cl. ............................................................. 364/724.2
[58] Field of Search ........................... 364/724.19–724.2; 375/229–236

[56] References Cited

U.S. PATENT DOCUMENTS 4,571,734  2/1986  Dolivo et al. .
4,644,564  2/1987  Dolivo et al. .
5,132,988  7/1992  Fisher et al. .
5,375,143  12/1994  Kazecki et al. .................. 375/233

*Primary Examiner*—Tan V. Mai
*Attorney, Agent, or Firm*—Burns, Doane, Swecker & Mathis, L.L.P.

[57] ABSTRACT

Data detection method and apparatus in a data storage device are provided. The data detection apparatus includes: a Random Access Memory (RAM) updating device for obtaining the average characteristic of the equalization signal $z_k$ from the symbol data $â_k$ and storing and updating the obtained result; threshold value calculator for calculating an optimal threshold value with respect to each data pattern from the average characteristic of the equalization signal $z_k$ updated in the RAM updating device; and a detector for detecting the value of the symbol data $â_k$ by comparing the equalization signal $z_k$ with the threshold value calculated in the threshold value calculator. Thus, a signal is detected by obtaining an average characteristic of a signal according to a data pattern and then using an optimal threshold value to detect the signal so that a signal having considerable non-linear distortion and a Direct Current (DC) offset can be reliably detected.

19 Claims, 6 Drawing Sheets

DATA DETECTION METHOD AND APPARATUS IN DATA STORAGE DEVICE

BACKGROUND OF THE INVENTION

The present invention relates to a data detection method and apparatus, and more particularly, to a data detection method and apparatus for detecting data recorded in a data storage device using a threshold value which varies according to a pattern of the recorded data.

A fast data storage device having a huge capacity for facilitating storing a great quantity of data is being studied. The general process of detecting the originally recorded data from a signal reproduced from a storage device is as follows. First of all, after high frequency noise of a reproduced analog signal r(t) passing an analog filter is removed, the signal r(t) is sampled into a digital signal $r_k$ by an analog-to-digital converter. The digital signal $r_k$ is equalized by a digital equalizer, and then, a symbol data recorded in the storage device is detected by a detector.

The data to be recorded in the storage device is generally encoded by a run-length limited (RLL) code to facilitate signal detection and timing adjustment of a sampling clock. The condition of run-length (d and k) is to limit the number of same symbols which sequentially appear in a row of recorded binary symbols, for example, +1, −1 or 0, 1. The minimum run-length (d) condition is that the same symbol should continue at least (d+1), and the maximum run-length (k) condition is that the same symbol should continue up to (k+1) at its maximum.

In the case of an optical or a magneto-optical disk storage device, due to the characteristics of recording media such as a laser and disk, the data should be encoded by the RLL code of which the minimum run-length (d) is over one or more to record the data in a higher density. In the case of a magnetic storage device such as an HDD (hard disk driver), since the nonlinear characteristic of a signal occurring in a high frequency data pattern makes the data detection difficult, the data is encoded by the RLL code of which "d" is over one or more to reduce the non-linearity of the signal.

The channel characteristic of the storage device can be generally and simply expressed into $(1+D)^n$(here, n=1, 2, . . . ) or $(1-D)(1+D)^n$(here, n=1, 2, . . . ). Here, "D" denotes 1 unit time delay. Since signal interference increases in a higher density, the channel is shown in a greater n value. In the case of a decision feedback equalizer (DFE, U.S. Pat. No. 5,132,988), an input signal is converted into a target response $d_k=a_k$, and then, data is detected by a simple threshold value detector. The DFE has merits of providing a simple detecting method and facilitating sampling clock adjustment since the data is detected every clock. However, in the case of a signal where signal interference is serious, a high frequency noise is amplified altogether in a process of equalizing into $d_k=a_k$, thus lowering detection performance. In the meantime, a partial response maximum likelihood (PRML, U.S. Pat. Nos. 4,571,734, 4,644,564) method, the input signal is converted into the target response of $d_k=a_k+a_{k-1}$ or $d_k=a_k-a_{k-2}$ to detect the data using a Viterbi decoder. The PRML method exhibits superior detection performance in recording density having signal interference where the channel characteristic is n=1. However, since the Viterbi decoder is used for data detection, the data detection process is fundamentally sophisticated and a clock restoring process is arduous.

SUMMARY OF THE INVENTION

To solve the above problems, it is an object of the present invention to provide a method for detecting original data in a data storage device by equalizing a reproduction signal of data encoded by a code of which the minimum run-length is over one or more to a target response of $d_k=a_{k-1}+2a_k+a_{k+1}$ and detecting a threshold value.

It is another object of the present invention to provide an apparatus adopting the above data detection method.

Accordingly, to achieve the first object, there is provided a data detection method of a data storage device for detecting symbol data $\hat{a}_k$ from an equalization signal $z_k$ when a digital signal $r_k$ is obtained by sampling a signal r(t) which is obtained by transmitting via a channel or recording on a recording medium a train of binary symbols $a_k$ where k is an integer, the equalization signal $z_k$ is obtained by equalizing the digital signal $r_k$, the method comprising the steps of: (a) detecting the symbol data $\hat{a}_k$ by selecting one among threshold values $T[a_{k-1}^{k-N}]$ using a previous symbol sequence $a_{k-1}^{k-N}$ and comparing the equalization signal $z_k$ with the selected threshold value; (b) updating a value $(1-\mu)G[a_{k+1}^{k-N}]+\mu z_k$, obtained by multiplying a value $G[a_{k-1}^{k-N}]$ of a RAM read using data sequence $a_{k-1}^{k-N}$ as an address by a first coefficient $1-\mu$ and the equalization signal $z_k$ by a second coefficient $\mu$, respectively, and adding both multiplied results, to a value $G[a_{k+1}^{k-N}]$ of an address $a_{k-1}^{k-N}$ of the RAM; and (c) from the updated RAM value output from said step (b) and the data sequence $a_{l+1}^{k-N}$, calculating a threshold value $T[a_{k-1}^{k-N}]$ used in detecting the symbol data $\hat{a}_k$ in step (a) according to an expression (1) when $a_{k-1}=a_{k-2}$, $$T[d_{k-1}^{k-N}] = \frac{G[\overline{a_{k-1}}, a_{k-1}, \hat{a}_{k-1}^{k-N}] + G[\overline{a_{k-1}}, \overline{a_{k-1}}, \hat{a}_{k-1}^{k-N}]}{2} \quad (1)$$

otherwise, according to an expression (2), $$T[d_{k-1}^{k-N}] = \frac{G[\overline{a_{k-1}}, a_{k-1}, \hat{a}_{k-1}^{k-N}] + G[\overline{a_{k-1}}, \overline{a_{k-1}}, a_{k-1}, \hat{a}_{k-1}^{k-N+1}]}{2} \quad (2)$$

wherein "N" is an arbitrary value greater than 1 and symbol $\overline{a_{k-1}}$ has the inverse value of symbol $a_{k-1}$.

To achieve the second object, there is provided a data detection apparatus of a data storage device for detecting symbol data $\hat{a}_k$ from an equalization signal $z_k$ when a digital signal $r_k$ is obtained by sampling a signal r(t) which is obtained by transmitting via a channel or recording on a recording medium a train of binary symbols $a_k$ where k is an integer, the equalization signal $z_k$ is obtained by equalizing the digital signal $r_k$, the apparatus comprising: RAM updating means for obtaining the average characteristic of the equalization signal $z_k$ from the symbol data $\hat{a}_k$ and storing and updating the obtained result; threshold value calculation means for calculating an optimal threshold value with resect to each data pattern from the average characteristic of the equalization signal $z_k$ updated in the RAM updating means; and a detector for detecting the value of the symbol data $\hat{a}_k$ by comparing the equalization signal $z_k$ with the threshold value calculated in the threshold value calculation means.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
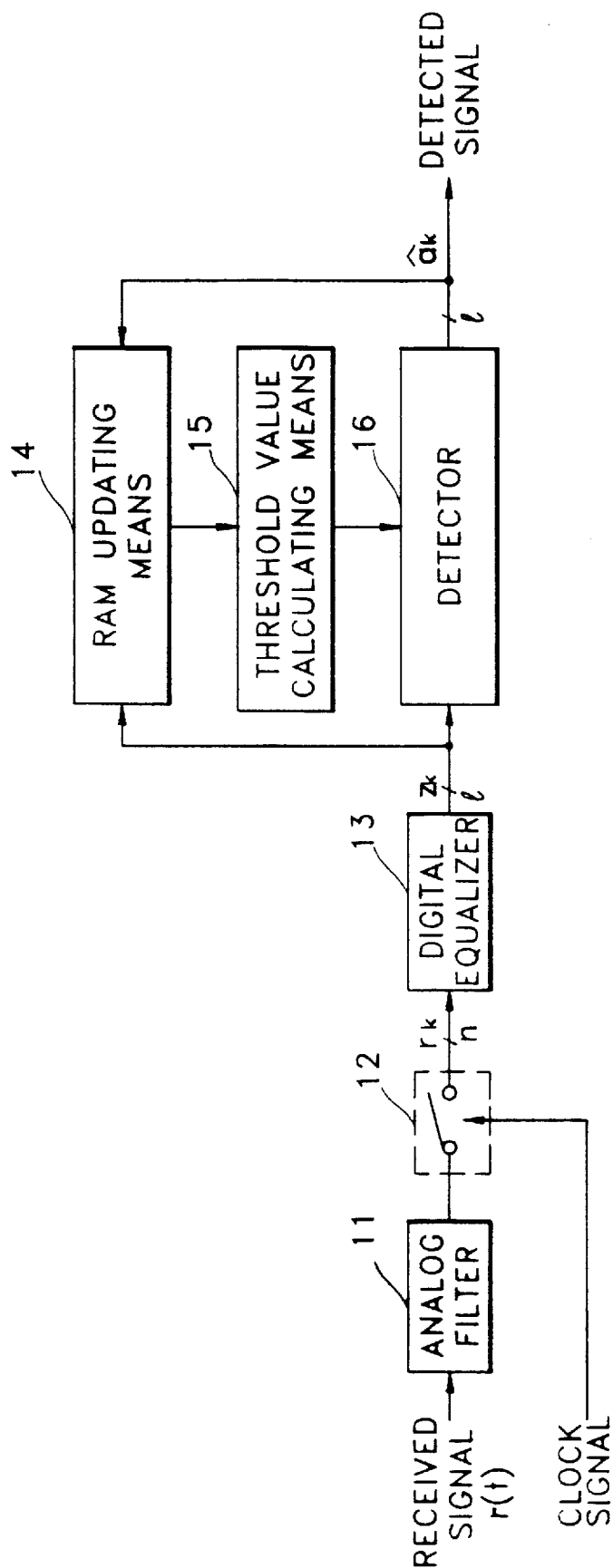
FIG. 1 is a block diagram illustrating a data detection apparatus according to the present invention in a data storage device.

FIG. 1 is a block diagram illustrating a data detection apparatus according to the present invention in a data storage device. In the drawing, the apparatus comprises an analog filter 11, an analog-to-digital converter 12, a digital equalizer 13, a RAM updating means 14, a threshold value calculating means 15 and a detector 16.

The operation of the apparatus having such a structure shown in FIG. 1 will be now described.

An analog signal r(t) reproduced from the data storage device passes the analog filter 11 during which a high frequency noise of the signal r(t) is removed. Then, the signal r(t) is sampled to an n-bit by the analog-to-digital converter 12 according to a given clock signal and output as a digital signal $r_k$. The digital signal $r_k$ is converted to a signal $z_k$ of l-bit befitting to detect data in the digital equalizer 13. Here, the digital equalizer 13 is implemented with a linear traversal filter or the DFE. The detector 16 is for detecting a symbol $â_{k+1}$ by comparing the output signal $z_k$ of digital equalizer 13 with a threshold value output from the threshold value calculating means 15. Here, an optimal threshold value in each data pattern is used for the detection to reduce an effect by the nonlinear characteristic of the signal and DC offset to detection performance. The optimal threshold value in each data pattern is obtained from the average characteristic of the signal $z_k$. That is, the RAM updating means 14 is for obtaining the average characteristic of the signal $z_k$ from the symbol $â_{k+1}$ and storing and updating the same. The threshold value calculating means 15 is for calculating the optimal threshold value with respect to each data pattern from the average characteristic of the signal $z_k$ output from the RAM updating means 14. Also, the RAM updating means 14 receives an equalization error $e_k$ of the equalization signal $z_k$ instead of equalization signal $z_k$ and a symbol data $â_k$ and update the value of RAM.

Figure 2:
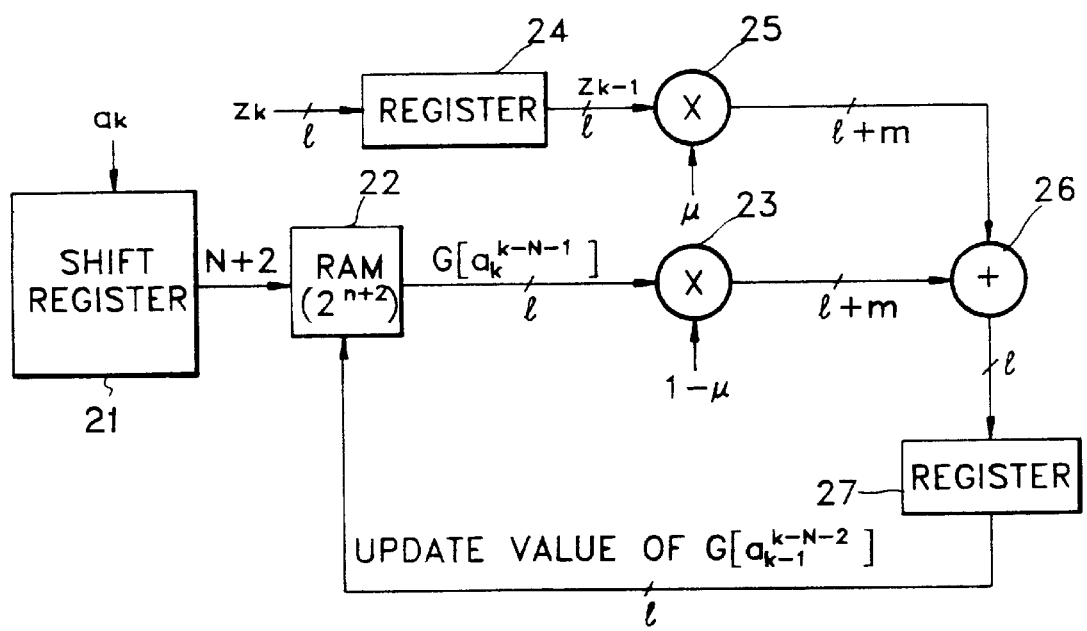
FIG. 2 is a circuit diagram illustrating a preferred embodiment of a RAM updating means of FIG. 1 according to the present invention.

FIG. 2 is a circuit diagram showing an embodiment of the RAM updating means 14. The circuit comprises a shift register 21, a RAM 22, first and second multipliers 23 and 25, first and second registers 24 and 27 and an adder 26.

The operation according to the structure of FIG. 2 will be now described.

First, a current binary symbol $a_k$ may have a value of +1 or −1, or 1 or 0.

In FIG. 2, a RAM updating process with respect to a signal $z_{k-1}$ is represented with 1 unit time delay since a future symbol $a_{k+1}$ is not known in a real implementation.

The RAM 22 is for storing the average of the signal $z_k$ corresponding to a data pattern $a_{k+1}^{k-N}=[a_{k+1}, a_k, \ldots a_{k-N}]$ and the average is represented as $G[a_{k+1}^{k-N}]$. Here, N denotes the number of previous symbols, and in this case, the address size of the RAM 22 is (N+2). The method of updating the RAM 22 is shown in the following expression (1).

$$G[a_{k+1}^{k-N}]=(1-\mu)G[a_{k+1}^{k-N}]+\mu z_k \qquad (1)$$

If a value of the previous symbol $a_{k-1}$ is already given, values to be taken by three symbol sequence $[a_{k+1}, a_k, a_{k-1}]$ have four of $[a_{k-1}, a_{k-1}, a_{k-1}]$, $[\overline{a_{k-1}}, a_{k-1}, a_{k-1}]$, $[\overline{a_{k-1}}, \overline{a_{k-1}}, a_{k-1}]$ and $[a_{k-1}, \overline{a_{k-1}}, a_{k-1}]$ Here, $\overline{a_k}$ signifies the inverse value of $a_k$. Assuming that data is encoded into a code where the minimum run-length (d) is 1 like a (1, 7) RLL code, there remain only three data sequence since the last data sequence among the above four is not available. In $[a_{k-1}, a_{k-1}, a_{k-1}]$ and $[\overline{a_{k-1}}, a_{k-1}, a_{k-1}]$, the $a_k$ is the same as $a_{k-1}$, and in $[\overline{a_{k-1}}, \overline{a_{k-1}}, a_{k-1}]$, the $a_k$ is the same as $\overline{a_{k-1}}$. Here, considering a signal value by each sequence, a decision boundary for deciding a value of a current symbol $a_k$ to $a_k=a_{k-1}$ or $a_k=\overline{a_{k-1}}$ is decided by a signal value of $[\overline{a_{k-1}}, a_{k-1}, a_{k-1}]$ and $[\overline{a_{k-1}}, \overline{a_{k-1}}, a_{k-1}]$.

In the meantime, the detailed operation of each components cf are PAM updating means 14 shown in FIG. 2 will now be described.

The shift register 21 is for receiving the symbol $â_k$ output from the detector 16 of FIG. 1 and outputting data $a_k^{k-N-1}$ of (N+2) bits.

The RAM 22 having a capacity of $2^{N+2}$ is for writing an output of the second register 27 using data $a_{k-1}^{k-N-2}$ output from the shift register 21 as a writing address and outputting $G[a_k^{k-N-1}]$ using the $a_k^{k-N-1}$ as a reading-out address.

The first multiplier 23 is for receiving the output $G[a_k^{k-N-1}]$ of the RAM 22 and outputting an (l+m) bits signal by multiplying the input value by a predetermined coefficient $(1-\mu)$. Simultaneously, the first register 24 is for receiving the output signal $z_k$ of the digital equalizer 13 of FIG. 1 and outputting a one-clock delayed signal $z_{k-1}$.

The second multiplier 25 is for receiving the output of $z_{k-1}$ of the first register 24 and outputting an (l+m) bits signal by multiplying the input value by a predetermined coefficient $\mu$.

The adder 26 is for adding the output of the first multiplier 23 and the output of the second multiplier 25 and outputting an l-bit signal.

The second register 27 is for receiving the output of the adder 26 and outputting a one-clock delayed signal $G[a_{k-1}^{k-N-2}]$.

Figure 3:
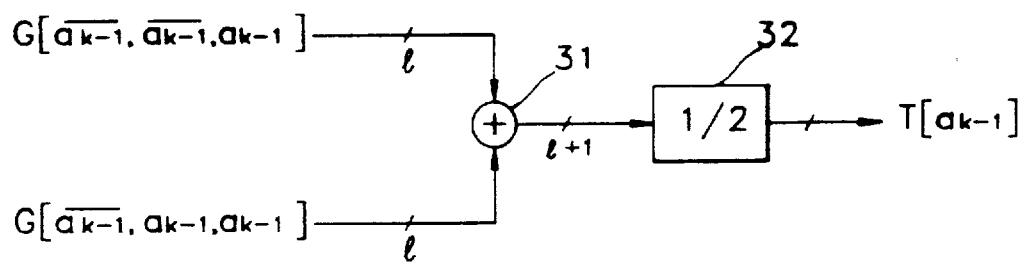
FIG. 3 is a block diagram illustrating a first embodiment of a threshold value calculation means of FIG. 1 according to the present invention.

FIG. 3 is a block diagram of a first embodiment of the threshold value calculating means 15 of FIG. 1. In the simplest case of N=1, the following expression (2) is to obtain an optimal threshold value $T[a_{k-1}]$.

$$T[a_{k-1}] = \frac{G[\overline{a_{k-2}}, a_{k-1}, a_{k-1}] + G[\overline{a_{k-1}}, \overline{a_{k-1}}, a_{k-1}]}{2} \qquad (2)$$

Meanwhile, the detailed operation of each component of the first embodiment of the threshold value calculating means 15 will now be described as shown in FIG. 3.

An adder 31 is for adding $[\overline{a_{k-1}}, a_{k-1}, a_{k-1}]$ and $[\overline{a_{k-1}}, \overline{a_{k-1}}, a_{k-1}]$ both being output from the RAM 22 of FIG. 2 in the RAM updating means 14 of FIG. 1 and outputting the result value.

A divider 32 is for dividing the output of the adder 31 by 2 and outputting the result value.

FIGS. 4 to 7 are circuit diagrams according to a second to fifth embodiments of the threshold value calculating means 15 of FIG. 1. When N is greater than 1, the following expressions (3) and (4) are provided since a data pattern of an input address of the RAM 22 of FIG. 2 should have a minimum run-length d=1.

When $a_{k-1} = a_{k-2}$, $$T[\hat{a}_{k-1}^{k-N}] = \frac{G[\overline{a_{k-1}}, a_{k-1}, \hat{a}_{k-1}^{k-N}] + G[\overline{a_{k-1}}, \overline{a_{k-1}}, \hat{a}_{k-1}^{k-N}]}{2} \quad (3)$$

When not, $$T[\hat{a}_{k-1}^{k-N}] = \frac{G[\overline{a_{k-1}}, a_{k-1}, \hat{a}_{k-1}^{k-N}] + G[\overline{a_{k-1}}, \overline{a_{k-1}}, a_{k-1}, \hat{a}_{k-1}^{k-N+1}]}{2} \quad (4)$$

In case of data sequence $a_{k-1}^{k-N}$ which does not satisfy the condition d=1, the value of the RAM is always "0," and accordingly, the threshold value always becomes "0."

Figure 4:
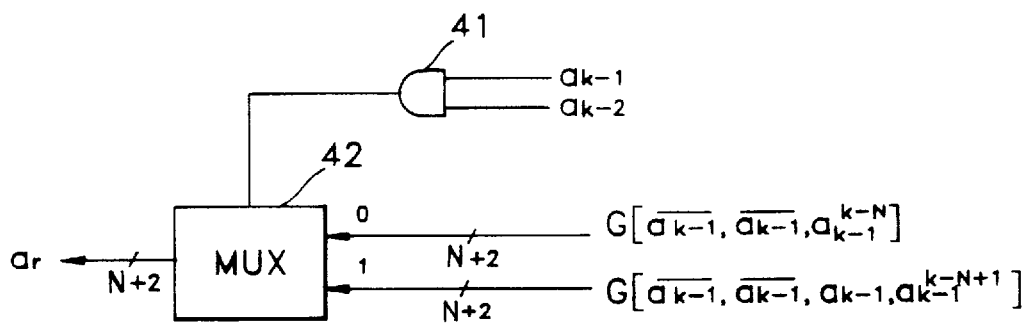
FIG. 4 is a block diagram illustrating a second embodiment of a threshold value calculation means of FIG. 1 according to the present invention.
Figure 4:
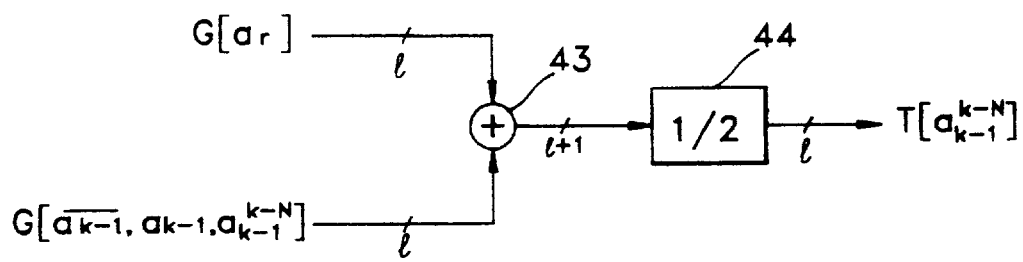

The detailed operation of each component of the second embodiment of the threshold value calculating means 15 shown in FIG. 4 is as follows.

An AND gate 41 is for comparing the symbol $a_{k-1}$ with another symbol $a_{k-2}$ and outputting the result.

A multiplexer 42 is for selectively outputting one sequence $a_r$ from (N+2) bit symbol sequence $[\overline{a_{k-1}}, \overline{a_{k-1}}, a_{k-1}^{k-N}]$ and another (N+2) bit symbol sequence $[\overline{a_{k-1}}, \overline{a_{k-1}}, a_{k-1}, a_{k-1}^{k-N+1}]$ according to the output of the AND gate 41.

An adder 44 is for adding a value $G[a_r]$ read from the RAM 22 of FIG. 2 using the output of multiplexer 42 as an address and a value $G[\overline{a_{k-1}}, a_{k-1}, a_{k-1}^{k-N}]$ read from another RAM 22 of FIG. 2 and outputting the result.

A divider 44 is for dividing the output of the adder 43 by 2 and outputting the result.

Figure 5:
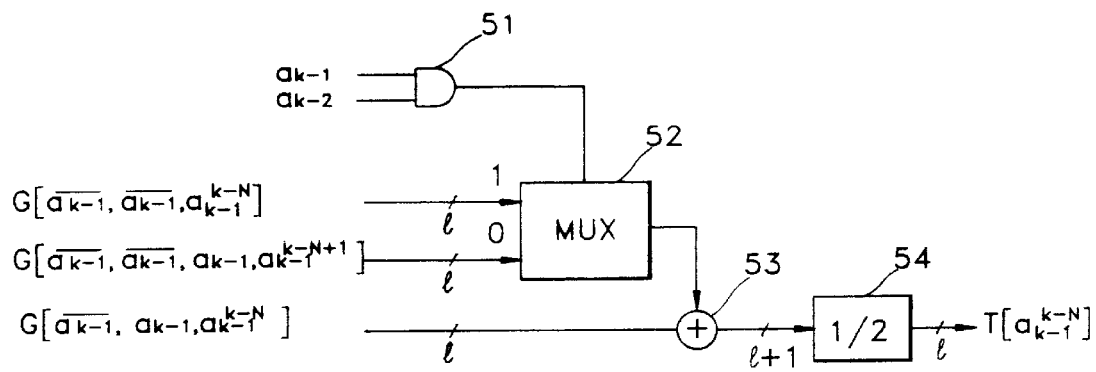
FIG. 5 is a block diagram illustrating a third embodiment of a threshold value calculation means of FIG. 1 according to the present invention.

Next, the detailed operation of each component of the third embodiment of the threshold value calculating means 15 as shown in FIG. 5 will now be described.

An AND gate 51 is for comparing the symbol $a_{k-1}$ with another symbol $a_{k-2}$ and outputting the result.

A multiplexer 52 is for selectively outputting one of an l-bit output $G[\overline{a_{k-1}}, \overline{a_{k-1}}, a_{k-1}^{k-N}]$ and another l-bit output $G[\overline{a_{k-1}}, \overline{a_{k-1}}, a_{k-1}, a_{k-1}^{k-N+1}]$ of the RAM 22 of FIG. 2 according to the output of the AND gate 51.

An adder 53 is for adding the output of the multiplexer 52 and a value $G[\overline{a_{k-1}}, a_{k-1}, a_{k-1}^{k-N}]$ read from the RAM 22 of FIG. 2 and outputting the result value.

A divider 54 is for dividing the output of the adder 53 by 2 and outputting the result value.

Figure 6:
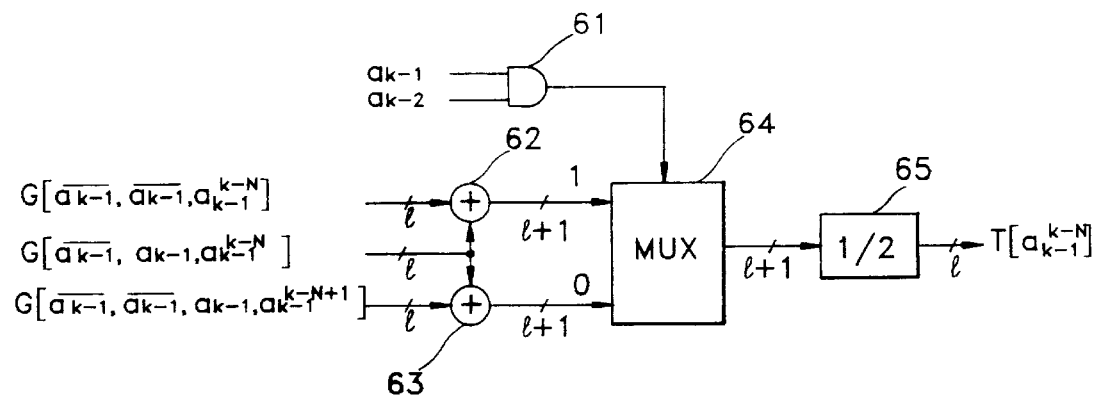
FIG. 6 is a block diagram illustrating a fourth embodiment of a threshold value calculation means of FIG. 1 according to the present invention.

The detailed operation of each component of the fourth embodiment of the threshold value calculating means 15 as shown in FIG. 6 will now be described.

An AND gate 61 is for comparing the symbol $a_{k-1}$ with another symbol $a_{k-2}$ and outputting the result.

A first adder 62 is for adding 1-bit output $G[\overline{a_{k-1}}, \overline{a_{k-1}}, a_{k-1}^{k-N}]$ and another l-bit output $G[\overline{a_{k-1}}, a_{k-1}, a_{k-1}^{k-N}]$ of the RAM 22 of FIG. 2 and outputting the result.

A second adder 63 is for adding the 1-bit output $G[\overline{a_{k-1}}, a_{k-1}, a_{k-1}^{k-N}]$ and another l-bit output $G[\overline{a_{k-1}}, \overline{a_{k-1}}, a_{k-1}, a_{k-1}^{k-N+1}]$ of the RAM 22 of FIG. 2 and outputting the result.

A multiplexer 64 is for selectively outputting one of the output of the first adder 62 and the output of the second adder 63 according to the output of the AND gate 61.

A divider 65 is for dividing the output of the multiplexer 64 by 2 and outputting the result value.

Figure 7:
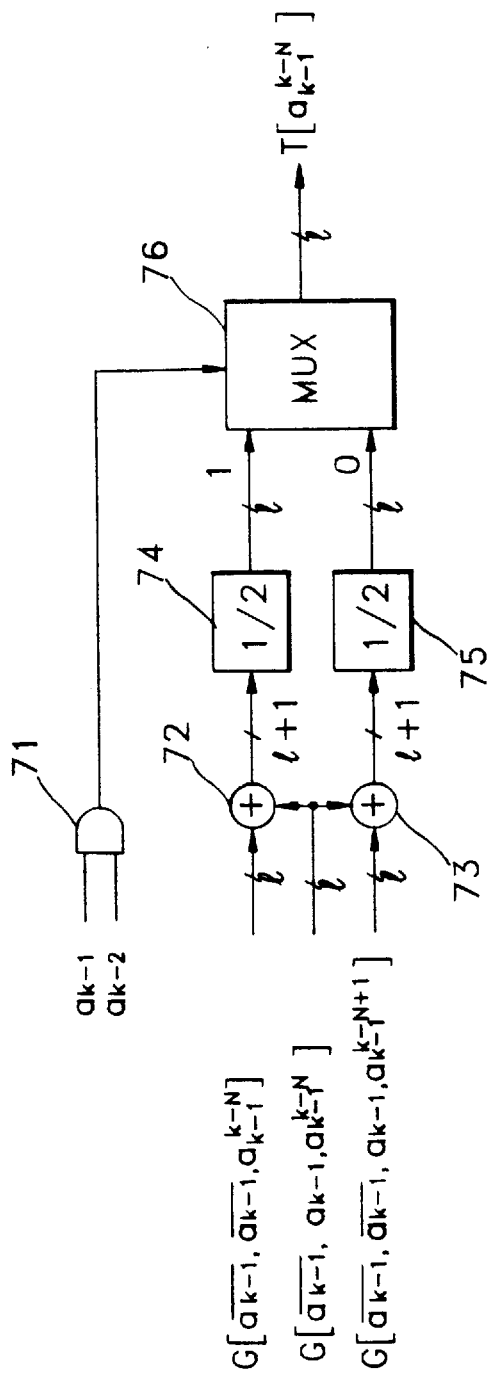
FIG. 7 is a block diagram illustrating a fifth embodiment of a threshold value calculation means of FIG. 1 according to the present invention.

The detailed operation of each component of the fifth embodiment of the threshold value calculating means 15 as shown in FIG. 7 will now be described.

An AND gate 71 is for comparing the symbol $a_{k-1}$ with another symbol $a_{k-2}$ and outputting the result.

A first adder 72 is for adding 1-bit output $G[\overline{a_{k-1}}, \overline{a_{k-1}}, a_{k-1}^{k-N}]$ and another 1-bit output $G[\overline{a_{k-1}}, a_{k-1}, a_{k-1}^{k-N}]$ of the RAM 22 of FIG. 2 and outputting the result.

A first divider 74 is for dividing the output of the first adder 72 by 2 and outputting the result.

A second adder 73 is for adding the 1-bit output $G[a_{k-1}, a_{k-1}, a_{k-1}^{k-N}]$ and another 1-bit output $G[\overline{a_{k-1}}, \overline{a_{k-1}}, a_{k-1}, a_{k-1}^{k-N+1}]$ of the RAM 22 of FIG. 2 and outputting the result.

A second divider 75 is for dividing the output of the second adder 73 by 2 and outputting the result value.

A multiplexer 76 is for selectively outputting one of the output of the first divider 74 and the output of the second divider 75 according to the output of the AND gate 71.

Figure 8:
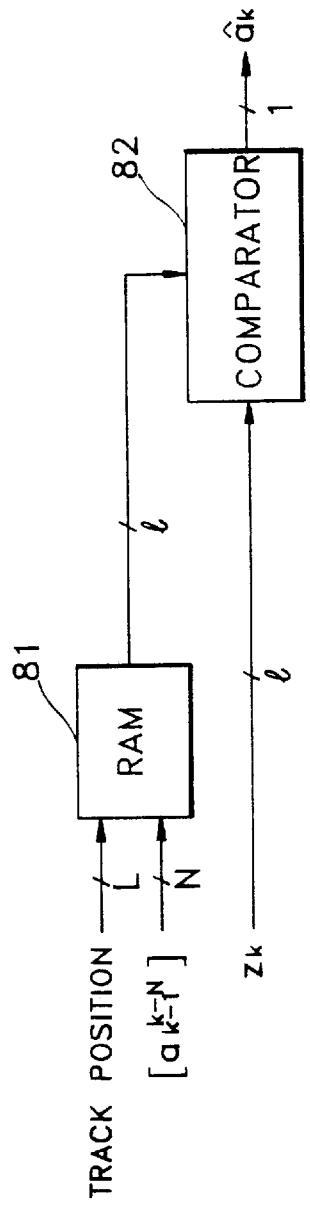
FIG. 8 is a block diagram illustrating a first embodiment of a detector of FIG. 1 according to the present invention.
Figure 9:
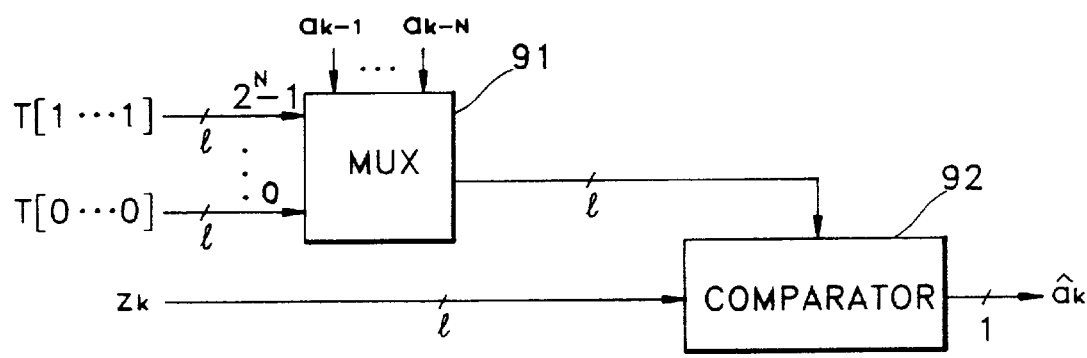
FIG. 9 is a block diagram illustrating a second embodiment of a detector of FIG. 1 according to the present invention.
Figure 10:
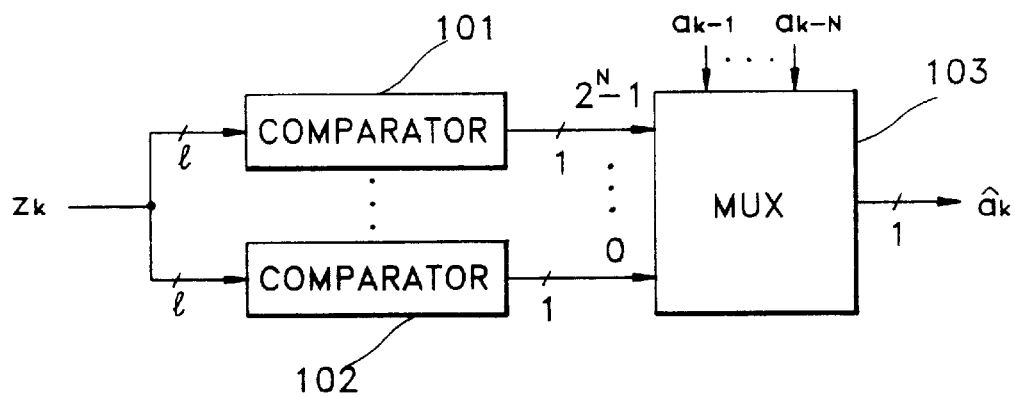
FIG. 10 is a block diagram illustrating a third embodiment of a detector of FIG. 1 according to the present invention.

FIGS. 8 to 10 are circuit diagrams according to the first to third embodiments of the detector 16 of FIG. 1. In a state where data ($a_{k-1}, a_{k-2}, \ldots$) has already been detected, the symbol $\hat{a}_k$ is obtained from the signal $z_k$ by the following expression (5).

$$\hat{a}_k = 1, \text{ if } z_k \geq T[a_{k-1}^{k-N}] \ \hat{a}_k = -1, \text{ otherwise} \quad (5)$$

First, the detailed operation of each component of the first embodiment of the detector 16 as shown in FIG. 8 is as follows.

A RAM 81 having capacity of $2^L \times 2^N$ is for outputting $T[a_{k-1}^{k-N}]$ using as a reading address an L bit value with respect to a disk track position output from a servo controller (not shown) and the N bit data $[a_{k-1}^{k-N}]$.

A comparator 82 is for comparing the output signal $z_k$ of the digital equalizer 13 of FIG. 1 with the output $T[a_{k-1}^{k-N}]$ of the RAM 81 and outputting the result.

Next, the detailed operation of each component of the second embodiment of the detector 16 as shown in FIG. 9 will now be described.

A multiplexer 91 is for selectively outputting any one among all the threshold values calculated in the threshold value calculating means 15 of FIG. 1 using data sequence $[a_{k-1}^{k-N}]$.

A comparator 92 is for comparing the output signal $z_k$ of the digital equalizer 13 of FIG. 1 with the output of the multiplexer 91 and outputting the result.

The detailed operation of each component of the third embodiment of the detector 16 as shown in FIG. 10 will now be described.

A first comparator 101 is for comparing the output signal $z_k$ of the digital equalizer 13 of FIG. 1 with threshold value $T[1 \ldots 1]$ and outputting the result.

Comparators 102 of $2^N-1$ units is for comparing the output signal $z_k$ of the digital equalizer 13 of FIG. 1 with threshold value $T[0 \ldots 0]$ and outputting the result.

A multiplexer 103 is for selectively outputting any one among signals output from $2^N$ unit comparators 101 and 102 using $[a_{k-1}^{k-N}]$.

As described above, in the data detection method and apparatus according to the present invention in a data storage device, a signal is detected by obtaining an average characteristic of a signal according to a data pattern and then using an optimal threshold value to detect the signal. Thus, a signal having considerable non-linear distortion and a DC offset can be detected with trust. Here, since the threshold value is obtained considering from an arbitrary N-unit time previous symbol and to current and 1 unit time future symbol, the threshold value is very effective in detecting a signal of considerable non-linear distortion. Also, the threshold value can be adaptively updated, an optimal value can be maintained though the characteristic of a reproduction signal gradually varies according to time.

Further, in the present invention, not only data can be detected with fidelity in a high density compared with the conventional DFE method equalizing the input signal to the target response $d_k=a_k$, but also the restoration of the sampling clock is easier than that in the PRML method due to the DFE structure.

What is claimed is:

1. A data detection method of a data storage device for detecting symbol data $â_k$ from an equalization signal $z_k$ when a digital signal $r_k$ is obtained by sampling a signal $r(t)$ which is obtained by transmitting via a channel or recording on a recording medium a train of binary symbols $a_k$ where k is an integer, the equalization signal $z_k$ is obtained by equalizing the digital signal $r_k$, said method comprising the steps of:

(a) detecting the symbol data $â_k$ by selecting one among threshold values $T[a_{k-1}^{k-N}]$ using a previous symbol sequence $a_{-1}^{k-N}$ and comparing said equalization signal $z_k$ with the selected threshold value;

(b) updating a value $(1-\mu)G[a_k^{k-N-1}]+\mu z_{k-1}$, obtained by multiplying a value $G[a_k^{k-N-1}]$ of a RAM read using data sequence $a_k^{k-N-1}$ as an address by a first coefficient $1-\mu$ and the equalization signal $z_{k-1}$ by a second coefficient $\mu$, respectively, and adding both multiplied results, to a value $G[a_k^{k-N-1}]$ of an address $a_k^{k-N-1}$ of the RAM; and (c) from the updated RAM value output from said step (b) and the data sequence $a_{k-1}^{k-N}$, calculating a threshold value $T[a_{k-1}^{k-N}]$ used in detecting the symbol data $â_k$ in said step (a) according to an expression (1) when $a_{k-1}=a_{k-2}$, $$T[a_{k-1}^{k-N}] = \frac{G[\overline{a_{k-1}}, a_{k-1}, â_{k-1}^{k-N}] + G[\overline{a_{k-1}}, \overline{a_{k-1}}, â_{k-1}^{k-N}]}{2} \quad (1)$$

otherwise, according to an expression (2), $$T[a_{k-1}^{k-N}] = \frac{G[\overline{a_{k-1}}, a_{k-1}, â_{k-1}^{k-N}] + G[\overline{a_{k-1}}, \overline{a_{k-1}}, a_{k-1}, â_{k-1}^{k-N+1}]}{2} \quad (2)$$

wherein "N" is an arbitrary value greater than 1 and symbol $\overline{a_{k-1}}$ has the inverse value of symbol $a_{k-1}$.

2. A data detection method of a data storage device according to claim 1, wherein in said step (a) a value of said symbol data $â_k$ is detected by comparing said equalization signal $z_k$ with each threshold value of all possible $2^N$ units taken by N-unit symbol sequences and selecting one from the comparison results as said previous symbol sequence $a_{k-1}^{k-N}$.

3. A data detection method of a data storage device according to claim 1, wherein in said step (b) a value of $(1-\mu)G[a_k^{k-N-1}]+\mu e_{k-1}$, obtained by multiplying the value $G[a_k^{k-N-1}]$ of said RAM using the data sequence $a_k^{k-N-1}$ as an address by the first coefficient $1-\mu$ and an equalization error $e_{k-1}$ of said equalization signal $z_{k-1}$ by the second coefficient $\mu$, respectively, and adding both multiplied results, is updated to the value $G[a_k^{k-N-1}]$ of the address $a_k^{k-N-1}$ of said RAM.

4. A data detection method of a data storage device according to claim 1, wherein in said step (c), when N=1, a threshold value $T[a_{k-1}]$ is obtained according to an expression (3) which is $$T[a_{k-1}] = \frac{G[\overline{a_{k-1}}, a_{k-1}, a_{k-1}] + G[\overline{a_{k-1}}, \overline{a_{k-1}}, a_{k-1}]}{2} \quad (3)$$

5. A data detection method of a data storage device according to claim 1, wherein in said step (c) tracks of a data storage disk is divided into arbitrary $2^L$-unit sections; the average characteristic of said equalization signal $z_k$ and $2^N$-unit optimal threshold values with respect to said previous symbol sequence $a_{k-1}^{k-N}$ are obtained in each section; threshold values of $2^L \times 2^N$ units are stored in said RAM; and appropriate threshold values $2^N$ are selected with respect to a current disk position.

6. A data detection method of a data storage device according to claim 5, wherein said symbol data is detected by selecting $2^N$ units among said threshold values of $2^L \times 2^N$ units with respect to the current disk position; comparing said equalization signal $z_k$ with $2^N$-unit threshold values; and then selecting one among the $2^N$ units as said previous symbol sequence $a_{k-1}^{k-N}$.

7. A data detection method of a data storage device according to claim 5, wherein a threshold value obtained by the average characteristic with respect to the error $e_k$ of said equalization signal $z_k$ instead of said equalization signal $z_k$ is used.

8. A data detection apparatus of a data storage device for detecting symbol data $â_k$ from an equalization signal $z_k$ when a digital signal $r_k$ is obtained by sampling a signal $r(t)$ which is obtained by transmitting via a channel or recording on a recording medium a train of binary symbols $a_k$ where k is an integer, the equalization signal $z_k$ is obtained by equalizing the digital signal $r_k$, said apparatus comprising:

RAM updating means for obtaining the average characteristic of said equalization signal $z_k$ from said symbol data $â_k$ and storing and updating the obtained result;

threshold value calculation means for calculating an optimal threshold value with resect to each data pattern from the average characteristic of said equalization signal $z_k$ updated in said RAM updating means; and a detector for detecting the value of said symbol data $â_k$ by comparing said equalization signal $z_k$ with the threshold value calculated in said threshold value calculation means.

9. A data detection apparatus of a data storage device according to claim 8, wherein said RAM updating means comprises:

a shift register for receiving said symbol data $â_k$ and ouputting an N+2 bits data;

a RAM having a capacity of $2^{N+2}$ for writing $G[a_{k-1}^{k-N-2}]$ using data $a_{k-1}^{k-N-2}$ output from said shift register as a writing address and outputting $G[a_k^{k-N-1}]$ using the $a_k^{k-N-1}$ as a reading-out address;

a first multiplier for receiving the output $G[a_k^{k-N-1}]$ of said RAM and outputting an (l+m) bits signal by multiplying the received value by a first coefficient $(1-\mu)$;

a first register for receiving said equalization signal $z_k$ and outputting a one-clock delayed signal $z_{k-1}$;

a second multiplier for receiving the output $z_{kk-1}$ of said first register and outputting an (l+m) bits signal by multiplying the received value by a second coefficient $\mu$;

an adder for adding the output of said first multiplier and that of said second multiplier and outputting an l-bit signal; and a second register for receiving the output of said adder and outputting a one-clock delayed signal $G[a_{k-1}^{k-N-2}]$ to said RAM .

10. A data detection apparatus of a data storage device according to claim 8, wherein, when the N is 1, said threshold value calculation means comprises:

an adder for adding $G[\overline{a_{k-1}}, a_{k-1}, a_{k-1}]$ and $G[\overline{a_{k-1}}, \overline{a_{k-1}}, a_{k-1}]$ output from said Ray updating means and outputting the result value; and a divider for dividing the output of said adder by 2 and outputting the result value as a threshold value $T[a_{k-1}]$.

11. A data detection apparatus of a data storage device according to claim 8, wherein, when the N is greater than 1, said threshold value calculation means comprises:

an AND gate for comparing a symbol $a_{k-1}$ with another symbol $a_{k-2}$ and outputting the result;

a multiplexer for selectively outputting one sequence $a_r$ from an (N+2) bit symbol sequence $[\overline{a_{k-1}}, \overline{a_{k-1}}, a_{k-1}^{k-N}]$ and another (N+2) bit symbol sequence $[a_{k-1}, a_{k-1}, a_{k-1}, a_{k-1}^{k-N+1}]$ according to the output of said AND gate;

an adder for adding a value $G[a_r]$ read from said RAM using the output of said multiplexer as an address, and another value $G[\overline{a_{k-1}}, a_{k-1}, a_{k-1}^{k-N}]$ read from said RAM in said RAM updating means, and outputting the result value; and a divider for dividing the output of said adder by 2 and outputting the result value.

12. A data detection apparatus of a data storage device according to claim 8, wherein, when the N is greater than 1, said threshold value calculation means comprises:

an AND gate for comparing a symbol $a_{k-1}$ with another symbol $a_{k-2}$ and outputting the result; a multiplexer for selectively outputting one of an l-bit output $G[\overline{a_{k-1}}, \overline{a_{kk-1}}, a_{k-1}^{k-N}]$ from the RAM and another l-bit output $G[a_{k-1}, a_{k-1}, a_{k-1}, a_{k-1}^{k-N-1}]$ from said RAM in the RAM updating means according to the output of said AND gate;

an adder for adding the output of said multiplexer and another value $G[\overline{a_{k-1}}, a_{k-1}, a_{k-1}^{k-N}]$ read from the RAM and outputting the result value; and a divider for dividing the output of said adder by 2 and outputting the result value.

13. A data detection apparatus of a data storage device according to claim 8, wherein, when the N is greater than 1, said threshold value calculation means comprises:

an AND gate for comparing a symbol $a_{k-1}$ with another symbol $a_{k-2}$ and outputting the result;

a first adder for adding an l-bit output $G[\overline{a_{k-1}}, \overline{a_{k-1}}, a_{k-1}^{k-N}]$ from the RAM and another l-bit output $G[\overline{a_{k-1}}, a_{k-1}, a_{k-1}^{k-N}]$ from the RAM in said RAM updating means and outputting the result value;

a second adder for adding an l-bit output $G[\overline{a_{k-1}}, \overline{a_{k-1}}, a_{k-1}, a_{k-1}^{k-N+1}]$ and the l-bit output $G[\overline{a_{k-1}}, a_{k-1}, a_{k-1}^{k-N}]$ from the RAM and outputting the result value;

a multiplexer for selectively outputting one of the outputs of said first and second adders according to the output of said AND gate; and a divider for dividing the output of said multiplexer by 2 and outputting the result value.

14. A data detection apparatus of a data storage device according to claim 8, wherein, when the N is greater than 1, said threshold value calculation means comprises:

an AND gate for comparing a symbol $a_{k-1}$ with another symbol $a_{k-2}$ and outputting the result;

a first adder for adding an l-bit output $G[\overline{a_{k-1}}, \overline{a_{k-1}}, a_{k-1}^{k-N}]$ from the RAM and another l-bit output $G[\overline{a_{k-1}}, a_{k-1}, a_{k-1}^{k-N}]$ from the RAM in said RAM updating means and outputting the result value;

a first divider for dividing the output of said first adder by 2 and outputting the result value;

a second adder for adding an l-bit output $G[\overline{a_{k-1}}, \overline{a_{k-1}}, a_{k-1}, a_{k-1}^{k-N+1}]$ and the l-bit output $G[\overline{a_{k-1}}, a_{k-1}, a_{k-1}^{k-N}]$ from the RAM in said RAM updating means and outputting the result value;

a second divider for dividing the output of said second adder by 2 and outputting the result value; and a multiplexer for selectively outputting one of the outputs of said first and second dividers according to the output of said AND gate.

15. A data detection apparatus of a data storage device according to claim 8, wherein said detector comprises:

a RAM having a capacity of $2^L 2^N$ for outputting $T[a_{k-1}^{k-N}]$ using as a reading address an L bit value with respect to a disk track position output from a servo controller and an N bit data $[a_{k-1}^{k-N}]$; and a comparator for comparing said equalization signal $z_k$ with the output $T[a_{k-1}^{k-N}]$ of said RAM and outputting the result.

16. A data detection apparatus of a data storage device according to claim 8, wherein said detector comprises:

a multiplexer for selectively outputting any one among all the threshold values calculated in said threshold value calculating means using $[a_{k-1}^{k-N}]$; and a comparator for comparing said equalization signal $z_k$ with the output of said multiplexer and outputting the result.

17. A data detection apparatus of a data storage device according to claim 8, wherein said detector comprises:

a first comparator for comparing said equalization signal $z_k$ with a threshold value $T[1 \ldots 1]$ and outputting the result;

comparators of $2^N$ units for comparing said equalization signal $z_k$ with a threshold value $T[0 \ldots 0]$ and outputting the result; and a multiplexer for selectively outputting any one among signals output from said $2^N$-unit comparators using $[a_{k-1}^{k-N}]$.

18. A data detection apparatus of a data storage device according to claim 8, wherein said RAM updating means receives an equalization error $e_k$ of said equalization signal $z_k$ instead of said equalization signal $z_k$ and said symbol data $\hat{a}_k$ and updating the value of said RAM.

19. A data detection method of a data storage device for detecting symbol data $\hat{a}_k$ from an equalization signal $z_k$ when a digital signal $r_k$ is obtained by sampling a signal r(t) which is obtained by transmitting via a channel or recording on a recording medium a train of binary symbols $a_k$ where k is an integer, the equalization signal $z_k$ is obtained by equalizing the digital signal $r_k$, said method comprising the steps of:

(a) obtaining the average characteristics of said equalization signal $z_k$ from said symbol data $\hat{a}_k$ and storing and updating the obtained result;

(b) calculating an optimal threshold value with respect to each data pattern from the average characteristics of said equalization signal $z_k$ updated in said step (a); and (c) detecting the value of said symbol data $\hat{a}_k$ by comparing said equalization signal $z_k$ with the threshold value calculated in said step (b).

* * * * *